US009396294B1

(12) United States Patent
Lyon et al.

(10) Patent No.: US 9,396,294 B1
(45) Date of Patent: Jul. 19, 2016

(54) METHOD OF MODELING AND SIMULATION OF SHAPED EXTERNAL OCCULTERS

(71) Applicant: The United States of America, as represented by the Administrator of the National Aeronautics and Space Administration, Washington, DC (US)

(72) Inventors: Richard G. Lyon, Marriottsville, MD (US); Mark Clampin, Baltimore, MD (US); Peter Petrone, III, Westminster, MD (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 275 days.

(21) Appl. No.: 14/039,119

(22) Filed: Sep. 27, 2013

Related U.S. Application Data

(60) Provisional application No. 61/870,381, filed on Aug. 27, 2013.

(51) Int. Cl.
| | |
|---|---|
| *G02B 23/12* | (2006.01) |
| *G06F 17/50* | (2006.01) |
| *H04N 5/33* | (2006.01) |
| *G03B 11/04* | (2006.01) |
| *G03B 11/02* | (2006.01) |
| *G03B 11/00* | (2006.01) |

(52) U.S. Cl.
CPC ............ *G06F 17/5009* (2013.01); *G02B 23/12* (2013.01); *G03B 11/00* (2013.01); *G03B 11/02* (2013.01); *G03B 11/04* (2013.01); *H04N 5/33* (2013.01)

(58) Field of Classification Search
CPC .................................. G03B 11/02; G03B 11/04
USPC .......................... 359/227, 234, 611, 612, 613
See application file for complete search history.

(56) References Cited

U.S. PATENT DOCUMENTS

| | | | | |
|---|---|---|---|---|
| 8,167,247 B2 * | 5/2012 | Daily | ..................... | G02B 5/005 244/158.1 |
| 8,480,241 B1 * | 7/2013 | Tenerelli | .............. | G02B 5/0278 244/172.6 |
| 2006/0177102 A1 * | 8/2006 | McGraw | ................. | G01W 1/02 382/107 |
| 2008/0180802 A1 * | 7/2008 | Cash | ...................... | G02B 27/58 359/601 |
| 2009/0153938 A1 * | 6/2009 | Arenberg | ............... | G09B 27/02 359/234 |

* cited by examiner

*Primary Examiner* — Bumsuk Won
*Assistant Examiner* — William R Alexander

(57) ABSTRACT

The present invention relates to modeling an external occulter including: providing at least one processor executing program code to implement a simulation system, the program code including: providing an external occulter having a plurality of petals, the occulter being coupled to a telescope; and propagating light from the occulter to a telescope aperture of the telescope by scalar Fresnel propagation, by: obtaining an incident field strength at a predetermined wavelength at an occulter surface; obtaining a field propagation from the occulter to the telescope aperture using a Fresnel integral; modeling a celestial object at differing field angles by shifting a location of a shadow cast by the occulter on the telescope aperture; calculating an intensity of the occulter shadow on the telescope aperture; and applying a telescope aperture mask to a field of the occulter shadow, and propagating the light to a focal plane of the telescope via FFT techniques.

27 Claims, 4 Drawing Sheets

METHOD OF MODELING AND SIMULATION OF SHAPED EXTERNAL OCCULTERS

CROSS REFERENCE TO RELATED APPLICATIONS

This application claims the benefit of U.S. patent application Ser. No. 61/870,381, entitled "SOFTWARE SUITE FOR MODELING OF SHAPED EXTERNAL OCCULTERS AND PHASE OCCULTED VISIBLE NULLING CORONAGRAPH," filed Aug. 27, 2013, which is incorporated herein by reference in its entirety.

ORIGIN OF THE INVENTION

The invention described herein was made by an employee of the United States Government and may be manufactured and used by or for the Government of the United States of America for governmental purposes without the payment of any royalties thereon or therefor.

FIELD OF THE INVENTION

The present invention relates to the modeling and simulation of shaped external occulters, including optically modeling diffraction from an arbitrarily-shaped external occulter for exoplanet coronagraphy, and for propagating the fields through an arbitrary telescope.

BACKGROUND

Direct detection and characterization of terrestrial (Earthlike) planets in orbit around nearby stars remains a tantalizing proposition. Planets are expected to be found from a few tens to a few hundred milli-arcseconds in angular separation from nearby stars and of an order $10^{-10}$ times dimmer in visible light and likely embedded in an unknown sea of scattered light from dust surrounding the star, and seen through local dust, in our solar system.

A multitude of coronagraphic techniques for the space-based direct detection and characterization of exo-solar terrestrial planets by increasing planetary contrast relative to starlight, allowing for angular separation of the planet light from its star, and ultimately spectroscopy of the planet, have been considered. These approaches generally include a single telescope with an internal starlight suppression scheme. Typical coronagraphs have internal shaped focal plane masks, and/or shaped or apodized pupil plane occulting masks, or complex shaped optics which emulate apodization, or an internal nulling interferometer, which block and/or diffract starlight thereby increasing the planet's contrast with respect to its parent star. Each of these internal methods have differing yet extreme requirements on wavefront, amplitude and polarization, generally requiring some form amplitude, wavefront, and polarization sensing and/or control with stressing optical and stability requirements. These stressing requirements are due to incompletely suppressed diffracted/scattered starlight leaking through to the focal plane, subsequently reducing the contrast of the planet with respect to the suppressed starlight.

An alternative technique is to place a starshade, i.e., external occulter 201, at some distance in front of the telescope 202 (see FIG. 2) to suppress the starlight, prior to entering the telescope 202, thereby mitigating stressing requirements in the telescope 202 system and relaxing it to that of more conventional space telescope technology. The external occulter 201 (see FIG. 2), at distance z in front of the telescope 202 along the line of sight to the stellar system (star 203) under study, creates a deep shadow and the telescope 202 resides within it. The starlight is suppressed and the light from the planet 204, off-axis relative to the line of sight, passes the edge of the occulter 201 and enters the telescope 202 aperture without reduction in throughput and independent of wavelength.

In FIG. 2, the "geometric" inner working angle (IWA) is shown as the ½ angle subtended by the occulter 201 as seen from the telescope 102, i.e., $\phi IWA=W/2z$, where W is the diameter of the occulter 201, and z is the separation of the occultere 101 to telescope 202; "geometric" since this is only true to the limit of geometric optics, i.e., as the wavelength tends to zero. In practice the "diffractive" IWA, defined herein as that angle at which the contrast of the planet 204 to suppressed starlight exceeds unity, is slightly smaller than the geometric IWA due to diffraction, and only a weak function of wavelength over the range of interest. The depth of suppression and focal plane contrast vary with wavelength, occulter 201 width, separation and telescope 202 aperture diameter.

The external occulter 201 can be realized in space by flying two spacecraft: one including the telescope system 202, and the other including the external occulter 201. Each spacecraft includes a spacecraft bus, attitude control, fuel and communications, and when acquiring a new target the telescope 202 just re-points but the occulter 201 must "fly" to the new line of sight to the target star 203, or alternatively both the telescope 202 and occulter 201 must reposition themselves. This levies additional requirements on the system and reduces the science duty cycle—however it may be the only viable approach with existing technology for direct planetary detection. This approach contains large design margins since suppression of starlight to $10^{-10}$ at the telescope 202 aperture yields a focal plane contrast significantly higher at the IWA.

An external occulter 201 typically contains hard edges, e.g., a circular disk, which causes Fresnel diffraction effects that tend to fill in, or brighten the shadow, thus, leaking starlight through the telescope. Previous occulters were large (200-800 meter) petaled external occulters placed at separations of $10^5$-$10^6$ km for potential use with the Hubble SpaceTelescope (HST) for planetary detection, but were considered infeasible for HST due to its orbital configuration. Other occulters included more reasonably sized external occulters (~70 m) at separations of 50,000-100,000 km, but with apodized transmission, i.e., graded transmission which is blocking in the center and changes continuously to transmitting towards it edge to better mitigate diffraction effects.

Hybrid approaches are also possible whereby an external occulter 201 performs partial suppression but subsequently cascaded with an internal coronagraph within the telescope 202. This approach would require more stringent telescope tolerances—increasing the telescope's 202 cost, but may allow a smaller, closer-in occulter 201 with relaxed tolerances and lower fuel mass, while increasing the science time since less time is required to "fly" to the next target star.

Hybrid approaches included hard-edged (circular and square) occulters coupled to an internal apodizer to theoretically obtain suppression levels of $10^{10}$. In another approach, a square occulter was used to conduct a ground demonstration to suppress Polaris. In another hybrid approach, a hyper-Gaussian apodization scheme has been used, but it was noted that a binary petaled occulter can approximate an apodized occulter and this has been shown to ~$10^{-7}$ with broadband light. Further, circularly symmetric graded apodizers can be well approximated by shaped binary occulting masks.

In another approach, a constrained linear optimization has been used to design an optimal one dimensional (1D) radial apodization function that suppresses broadband (0.4-1.2 microns) while simultaneously maintaining the intensity in the telescope aperture at $10^{-1}$, and this apodized "Vanderbei" occulter has been approximated using a binary petaled occulter. This Vanderbei form for the external occulter is currently the most effective design for an occulter which performs all the suppression external to the telescope, and has the flattest spectral response. Indeed optimal occulter shapes have been designed that can achieve smaller inner working angles than conventional coronagraphs and yet have high effective throughput allowing smaller aperture telescopes to achieve the same coronagraphic resolution and similar sensitivity as larger ones.

Thus a complex trade space exists between science, technical feasibility and cast with respect to the design of an externally occulted coronagraph, and the present invention was developed to model the occulter with errors and show parametric simulations with the end goal of ultimately exploiting this complex trade space.

SUMMARY

Additional features and advantages of the invention will be set forth in the description which follows, and in part will be obvious from the description, or may be learned by practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth herein.

In the present invention, an exemplary external occulter blocks starlight entering a telescope, thereby allowing the relation of the tolerances on the telescope. The objective of the external occulter is to minimize starlight while passing the light of the exoplanet, thereby increasing the contrast by approximately 10 orders of magnitude. The external occulter can be realized in space by flying two spacecraft: one including the telescope system, and the other including the external occulter.

In one embodiment, the present invention relates to optically modeling diffraction from an arbitrarily-shaped external occulter for exoplanet coronagraphy, and for propagating the fields through an arbitrary telescope. The present invention utilizes diffraction theory to achieve these aims, and allows for rigid body misalignments, shape errors and deformations, and wavefront and amplitude errors in the telescope. The present invention works in both broadband and narrowband, and may be executed on at least a single processor of a computer system, in about two minutes per wavelength.

Assessment of the optical performance of the exemplary occulter design requires Fresnel diffraction in two dimensions (2D) to propagate the light from the external occulter to the telescope, and then further diffractive propagation through the telescope to the focal plane. The present invention performs these two propagations but with the addition of manufacturing, deployment, vibrational errors, holes and deformations on the external occulter, and with the addition of wavefront and amplitude errors within the telescope. The propagation approach is parametric with respect to the wavelength of light and with respect to mis-pointing of the occulter and telescope relative to the star.

Generally the shape of the occulter is designed and optimized based on a one dimensional (1D) approximation of the shaped external occulter as an apodization function. However, this approach does not lend itself to tolerancing since the problem must be solved in two dimensions (2D). In contrast to the standard approach of 2D Fourier transforms implemented numerically as fast Fourier transforms (FTT) to propagate, which results in very large grids sizes to obtain the sampling density needed (and hence very large computers), the present invention exploits the linearity of Maxwell's equations to propagate, with errors, by first propagating the ideal occulter, and then the errors separately. This allows the addition of the errors to the ideal propagation to occur in the complex domain and the error propagation can use small grids that run efficiently on small computers, even laptop computers.

In one embodiment, the present invention shows sensitivity results with respect to the number and shape errors of petals, spectral passband, accuracy of Fresnel propagation, and shows results for both filled and segmented aperture telescopes, and encompasses acquisition and sensing of the occulter's location relative to the telescope.

In one embodiment, a method of modeling of an external occulter includes: providing at least one processor executing program code to implement a simulation system, the program code including the steps of: providing an external occulter having a plurality of petals, the occulter being coupled to a telescope; and propagating light from the occulter to a telescope aperture of the telescope by scalar Fresnel propagation, by: obtaining an incident field strength at a predetermined wavelength at an occulter surface; obtaining a field propagation from the occulter to the telescope aperture using a Fresnel integral; modeling a celestial object at differing field angles by shifting a location of a shadow cast by the occulter on the telescope aperture; calculating an intensity of the occulter shadow on the telescope aperture; and applying a telescope aperture mask to a field of the occulter shadow, and propagating the light to a focal plane of the telescope via fast Fourier transform (FFT) techniques.

In one embodiment, the occulter is a binary occulter approximated by a radially symmetric occulter.

In one embodiment, the celestial body is a planet, and wherein an effective IWA is less than a geometric IWA, allowing detection of the planet inside a geometric footprint of said occulter.

In one embodiment, the plurality of petals is more than 10.

In one embodiment, modeling of shape errors and holes errors in the occulter is performed by: calculating a perturbed shadow of the occulter by Fresnel diffraction and coherently adding to an unperturbed field; and then propagating from the occulter to the telescope aperture via scalar Fresnel propagation.

In one embodiment, a single petal of the plurality of petals has an allowable truncation error of 10 mm or less.

In one embodiment, the plurality of petals has an allowable truncation error of 8 mm or less.

In one embodiment, the telescope aperture is one of a filled, segmented or sparse aperture system.

In one embodiment, a plurality of samplings on images are obtained from the focal plane; and sampled images are spatially integrated with images of stellar leakage over $\lambda/4D$, $\lambda/2D$, and $\lambda/D$ detector pixels.

In one embodiment, the occulter includes a plurality of laser beacons mounted at bases of the plurality of petals, the laser beacons being pulse code modulated at a different temporal frequency.

In one embodiment, the method further includes separating a focal plane of the telescope into a plurality of channels, using beamsplitters; acquiring one or more beam spots from the laser beacons using a coarse acquisition channel of one of the plurality of channels; sensing a lateral location of the occulter using a pupil imaging channel of another of the plurality of channels; and using a fine acquisition channel of another of the plurality of channels, to fine sense the location of the occulter.

In one embodiment, an external occulter system, includes at least one processor executing program code, said program code including the steps of: providing an external occulter having a plurality of petals, the occulter being coupled to a telescope; and propagating light from the occulter to a telescope aperture of the telescope by scalar Fresnel propagation, by: obtaining an incident field strength at a predetermined wavelength at an occulter surface; obtaining a field propagation from the occulter to the telescope aperture using a Fresnel integral; modeling a celestial object at differing field angles by shifting a location of a shadow cast by the occulter on the telescope aperture; calculating an intensity of the occulter shadow on the telescope aperture; and applying a telescope aperture mask to a field of the occulter shadow, and propagating the light to a focal plane of the telescope via fast Fourier transform (FFT) techniques.

In one embodiment, a non-transitory computer-accessible medium has a program which contains executable instructions, the program including the steps of providing an external occulter having a plurality of petals, the occulter being coupled to a telescope; and propagating light from the occulter to a telescope aperture of the telescope by scalar Fresnel propagation, by: obtaining an incident field strength at a predetermined wavelength at an occulter surface; obtaining a field propagation from the occulter to the telescope aperture using a Fresnel integral; modeling a celestial object at differing field angles by shifting a location of a shadow cast by the occulter on the telescope aperture; calculating an intensity of the occulter shadow on the telescope aperture; and applying a telescope aperture mask to a field of the occulter shadow, and propagating the light to a focal plane of the telescope via fast Fourier transform (FFT) techniques.

In one embodiment, an occulter acquisition system, includes: a telescope; an external occulter having a plurality of petals, the occulter being coupled to said telescope; a plurality of laser beacons mounted at bases of the plurality of petals of the occulter, the laser beacons being pulse code modulated at a different temporal frequency; a plurality of beamsplitters provided in the telescope, which separate a focal plane of the telescope into a plurality of channels; wherein the plurality of channels include a coarse acquisition channel which acquires one or more beam spots from the laser beacons, a pupil imaging channel which senses a lateral location of the occulter, and a fine acquisition channel which fine senses the location of the occulter.

In one embodiment, the laser beacons are laser diodes.

In one embodiment, beams from the laser beacons are shifted in angle from normal to allow a larger capture range of the occulter.

In one embodiment, the pupil imaging channel images a region of a shadow of the occulter truncated by an aperture of the telescope.

In one embodiment, an IR camera captures the image.

In one embodiment, lateral shifts of the occulter changes a pattern and flux on the IR camera.

The present invention has application in any type of diffractive beam propagation, and potentially various types of microscopy, beam-forming optics for defense, and any application where a dim optic is desired to be seen close to a bright object.

BRIEF DESCRIPTION OF THE DRAWINGS

In order to describe the manner in which the above-recited and other advantages and features of the present invention can be obtained, a more particular description of the invention briefly described above, will be rendered by reference to specific embodiments thereof, which are illustrated in the appended drawings. Understanding that these drawings depict only exemplary embodiments of the invention and are not therefore to be considered to be limiting of its scope, the present invention will be described and explained with additional specificity and detail through the use of the accompanying drawings in which.

DETAILED DESCRIPTION

In the following detailed description, reference is made to the accompanying drawings that form a part hereof, and in which is shown by way of illustration, specific embodiments which may be practiced. These embodiments are described in sufficient detail to enable those skilled in the art to practice the embodiments, and it is to be understood that other embodiments may be utilized and that logical, mechanical, electrical, software, and other changes may be made without departing from the scope of the embodiments. The following detailed description is, therefore, not to be taken in a limiting sense. A person skilled in the relevant art will recognize that other components and configurations may be used without parting from the spirit and scope of the invention.

It will be understood that, although the terms first, second, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved. Furthermore, some steps, acts, and/or functions of any methodology may be implemented in alternating order depending upon the function/acts involved.

Figure 1:
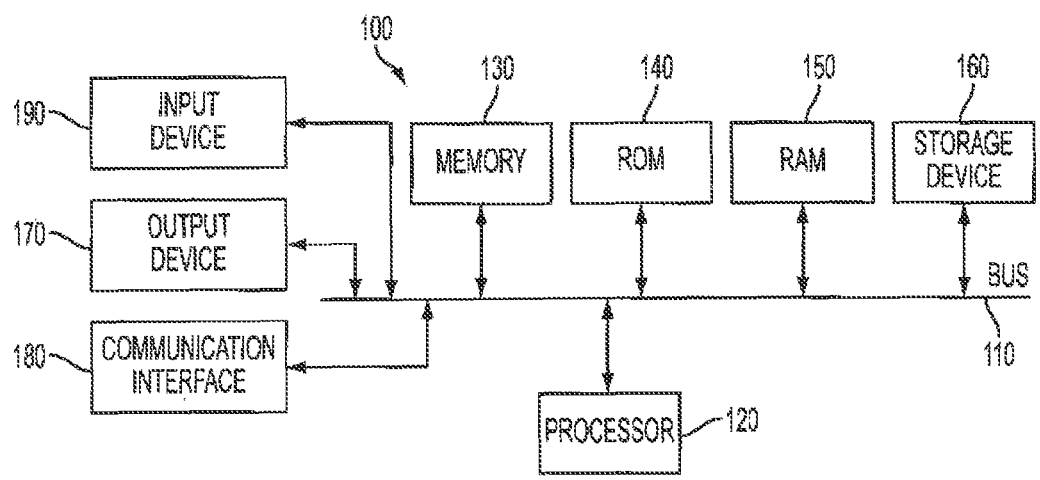
FIG. 1 is a block diagram of an exemplary general-purpose computing system according to one embodiment consistent with the present invention.
Figure 2:
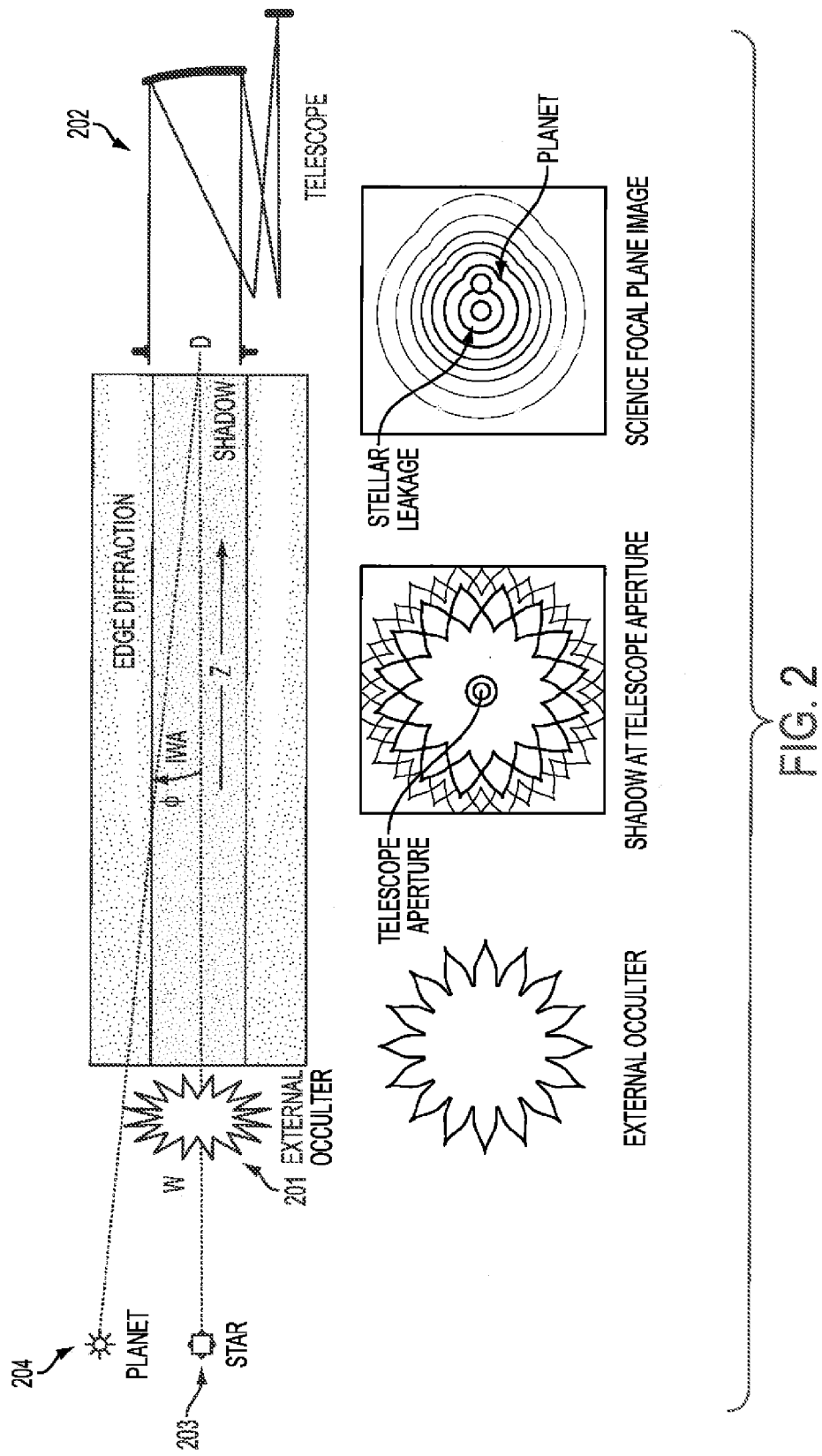
FIG. 2 is a schematic diagram of a conventional externally occulted coronagraph according to one embodiment consistent with the present invention.

With reference to FIG. 1, an exemplary system includes general-purpose computing device 100, including a processing unit (CPU) 120 and a system bus 110 that couples various system components including the system memory, such as read-only memory (ROM) 140 and random access memory (RAM) 150 to the processing unit 120. Other system memory 130 may be available for use as well. It can be appreciated that the invention may operate on a computing device with more than one CPU 120 or on a group or cluster of computing devices networked together to provide greater processing capability. A processing unit 120 can include a general purpose CPU controlled by software as well as a special-purpose processor. An Intel® Xeon LV L7345 processor is an example of a general purpose CPU which is controlled by software. Particular functionality may also be built into the design of a separate computer chip. An STMicroelectronics STA013 processor is an example of a special-purpose processor which decodes MP3 audio files. Of course, a processing unit includes any general purpose CPU and a module configured to control the CPU as well as a special-purpose processor where software is effectively incorporated into the actual processor design. A processing unit may essentially be a completely self-contained computing system, containing multiple cores or CPUs, a bus, memory controller, cache, etc. A multi-core processing unit may be symmetric or asymmetric.

The system bus 110 may be any of several types of bus structures including a memory bus or memory controller, a peripheral bus, and a local bus using any of a variety of bus architectures. A basic input/output (BIOS) stored in ROM 140 or the like, may provide the basic routine that helps to transfer information between elements within the computing device 100, such as during start-up. The computing device 100 further includes storage devices such as a hard disk drive 160, a magnetic disk drive, an optical disk drive, tape drive or the like. The storage device 160 is connected to the system bus 110 by a drive interface. The drives and the associated computer readable media provide nonvolatile storage of computer readable instructions, data structures, program modules and other data for the computing device 100. In one aspect, a hardware module that performs a particular function includes the software component stored in a tangible computer-readable medium in connection with the necessary hardware components, such as the CPU, bus, display, and so forth, to carry out the function. The basic components are known to those of skill in the art and appropriate variations are contemplated depending on the type of device, such as whether the device is a small, handheld computing device, a desktop computer, or a computer server.

Although the exemplary environment described herein may employ a hard disk, it should be appreciated by those skilled in the art that other types of computer-readable media which can store data that are accessible by a computer, such as magnetic cassettes, flash memory cards, digital versatile disks, cartridges, random access memories (RAMs), read only memory (ROM), a cable or wireless signal containing a bit stream and the like, may also be used in the exemplary operating environment.

To enable user interaction with the computing device 100, an input device 190 represents any number of input mechanisms, such as a microphone for speech, a touch-sensitive screen for gesture or graphical input, keyboard, mouse, motion input, speech and so forth. The input may be used by the presenter to indicate the beginning of a speech search query. The device output 170 can also be one or more of a number of output mechanisms known to those of skill in the art. In some instances, multimodal systems enable a user to provide multiple types of input to communicate with the computing device 100. The communications interface 180 generally governs and manages the user input and system output. There is no restriction on the invention operating on any particular hardware arrangement and therefore the basic features here may easily be substituted for improved hardware or firmware arrangements as they are developed.

For clarity of explanation, the illustrative system embodiment is presented as comprising individual functional blocks (including functional blocks labeled as a "processor"). The functions these blocks represent may be provided through the use of either shared or dedicated hardware, including, but not limited to, hardware capable of executing software and hardware, such as a processor, that is purpose-built to operate as an equivalent to software executing on a general purpose processor. For example the functions of one or more processors presented in FIG. 1 may be provided by a single shared processor or multiple processors. (Use of the term "processor" should not be construed to refer exclusively to hardware capable of executing software.) Illustrative embodiments may comprise microprocessor and/or digital signal processor (DSP) hardware, read-only memory (ROM) for storing software performing the operations discussed below, and random access memory (RAM) for storing results. Very large scale integration (VLSI) hardware embodiments, as well as custom VLSI circuitry in combination with a general purpose DSP circuit, may also be provided.

The logical operations of the various embodiments are implemented as: (1) a sequence of computer implemented steps, operations, or procedures running on a programmable circuit within a general use computer, (2) a sequence of computer implemented steps, operations, or procedures running on a specific-use programmable circuit; and/or (3) interconnected machine modules or program engines within the programmable circuits.

According to one embodiment, the present invention may be implemented using software applications that reside in a client and/or server environment. According to another embodiment, the present invention may be implemented using software applications that reside in a distributed system over a computerized network and across a number of client computer systems. Thus, in the present invention, a particular operation may be performed either at the client computer, the server, or both. While the system of the present invention may be described as performing certain functions, one of ordinary skill in the art will readily understand that the program may perform the function rather than the entity of the system itself. According to one embodiment of the invention, the program that runs the system 100 may include separate programs having code that performs desired operations. According to one embodiment, the program that runs the system 100 may include a plurality of modules that perform sub-operations of an operation, or may be part of a single module of a larger program that provides the operation. Further, although the above-described features and processing operations may be realized by dedicated hardware, or may be realized as programs having code instructions that are executed on data processing units, it is further possible that parts of the above sequence of operations may be carried out in hardware, whereas other of the above processing operations may be carried out using software.

According to one embodiment of the invention, the server may include a single unit or may include a distributed system having a plurality of servers or data processing units. The server(s) may be shared by multiple users in direct or indirect connection to each other. The server(s) may be coupled to a communication link that is preferably adapted to communicate with a plurality of client computers. Although the above physical architecture has been described as client-side or server-side components, one of ordinary skill in the art will appreciate that the components of the physical architecture may be located in either client or server, or in a distributed environment.

The underlying technology allows for replication to various other sites. Each new site may maintain communication with its neighbors so that in the event of a catastrophic failure, one or more servers may continue to keep the applications running, and allow the system to load-balance the application geographically as required.

Having discussed some fundamental system elements, the disclosure turns to the exemplary embodiments of modeling and simulating external occulters through a particular exemplary telescope. The disclosure describes the methods embodiments in terms of systems configured to practice the methods.

Exemplary Baseline Terrestrial Planet Finder Occulter Architectures

In one embodiment, a terrestrial planet finder occulter (TPF-O) is provided, and may have two exemplary embodiments of baseline TPF-O architectures (see Table 1), which include an exemplary single external 16 petal occulter coupled to either a 4 m or 2.4 m diameter telescope, with 50 m or 36.67 m occulter diameters at 72,000 km or 28,720 km, with geometric inner working angles (IWAs) of 72 mas and 98 mas, respectively.

TABLE 1

Exemplary TPF-O Baseline Architectures

| Tel. Diam. (meters) | Separation Occ-to-Tel (kilometers) | Occ Diam Tip-to-Tip (meters) | Dark Hole Diameter (meters) | Geom IWA (mas) | □/D □ = 0.5 um (mas) | Geometric IWA (□/D) | $M_v = 5$ Ap flux (ph/sec) | Δt to ph lim SNR = 5 (seconds) |
|---|---|---|---|---|---|---|---|---|
| 4.0 | 72,000 | 50.00 | 6.0 | 72 | 25.78 | 2.78 | 1.3E+09 | 398 |
| 2.4 | 38,720 | 36.67 | 4.4 | 98 | 42.97 | 2.27 | 4.5E+08 | 1105 |

The petaled shape of the exemplary embodiment occulter is the Vanderbei (V) form optimized over the spectral range of 0.4-1.0 microns. The V-band (500-600 nm) aperture fluxes are as shown in Table 1, and for an exemplary planet at $10^{-10}$ would yield 0.13 and 0.045 planetary photons/sec for the 4.0 and 2.4 m apertures, respectively. In the exemplary embodiment, a product of the telescope optical transmission with the detector quantum efficiency of 0.5 yields reasonable times to photon limited signal-to-noise ratio (SNR) of 5 in V-band of 398 sec and 1105 seconds, respectively. Further, in the exemplary embodiment, the time to SNR is purely the SNR without any exo- or local-Zodi, and not assuming any leakage of the starlight, and it is shown purely as a lower bound (the actual integration times may he longer).

Scaling the exemplary embodiment of the occulter to other telescope sizes is straightforward since Fresnel diffraction scales with Fresnel number. The exemplary embodiment of the occulter operates at a Fresnel number of $W^2/\Box_z = 69.4$ at $\Box = 0.5$ microns for an exemplary 50 meter occulter at 72,000 km. If the Fresnel number is conserved, the functional form of the occulter's shadow remains unchanged; only its spatial scale is changed. This can be shown by a simple change of variables on the Fresnel integral (Eqn. 1).

$$E_{II}(x', y'; z) = \frac{-i}{\lambda z} \int_{-\infty}^{\infty} \int_{-\infty}^{\infty} T(x, y) E_I(x, y) e^{i\frac{\pi}{\lambda z}[(x-x')^2+(y-y')^2]} dx dy \quad (1)$$

where (x',y') are output coordinates at the plane of the telescope aperture.

Changing to the other exemplary embodiment occulter of size 36.67 meters implies that $z_2=(W_2/W_1)^2 z_1$ where $z_1=72,000$ km separation and $W_1=50$ m yields a separation of 38,720 km.

The central dark hole diameter scales linearly with the exemplary embodiments of the occulter sizes, from 6.0 meters to 4.4 meters, and the geometric IWA scales from 72 to 98 mas, in methods well known to one of ordinary skill in the art. The geometric IWA is the ½ angle subtended by the exemplary occulter diameter as seen from the telescope, i.e., $\Box_{IWA}=W2z$ in the small angle approximation.

Binary External Occulter

In one embodiment, a radially symmetric exemplary occulter may be approximated by an exemplary binary occulter. A hyper-Gaussian and a Vanderbei form of amplitude attenuation function A(r) can be plotted versus normalized radius, with the graded transmission of the exemplary occulter, obtained by rotating the attenuation function into 2D about r=0. An exemplary 16-petal binary approximation occulter can be achieved from the graded occulter. The exemplary binary occulter is obtained by requiring the integral of the transmission function around a radial zone to be the same for both the graded and binary occulters, for instance:

$$\int_0^{2\pi} A_{graded}(r) d\theta = \int_0^{2\pi} A_{binary}(r, \theta) d\theta \quad (2)$$

for any r where $A_{graded}(r)$, and $A_{binary}(r,\theta)$ is at either unity or zero.

In one embodiment, the intensity, i.e., shadow, at the telescope aperture plane for the resulting graded and binary occulters, and where the telescope resides, shows that the suppression is $\sim 10^{-10}$ for both exemplary graded and binary occulters. The primary difference is that towards the dark hole edges, in the exemplary embodiment, more intensity modulation is evident for the binary occulter whereas the graded occulter intensity is smooth.

Occulter-to-Telescope Propagation

In one embodiment, propagation of the light from the exemplary occulter to the exemplary telescope aperture is via scalar Fresnel propagation. The field incident on the exemplary occulter from a distant source is effectively a plane wave:

$$E_I(x, y) = E_0(\lambda) e^{i\frac{2\pi}{\lambda}(\alpha x + \beta y)} \quad (3)$$

where $(\alpha,\beta)$ are small incidence angles with respect to the occulter surface normal, (x,y) are coordinates along the occulter surface, and $E_0(\lambda)$ is the field strength at wavelength λ. An overall phase factor in z has been neglected.

The effect of the exemplary occulter is to multiply the incident field by a transmission function T(x,y), which can be complex; however, in the exemplary embodiment herein, T(x,y)=0 interior to, and T(x,y)=1 exterior to the occulter. The field propagation from z=0 (occulter plane) to z (telescope aperture plane), is accomplished by the Fresnel integral stated above with respect to Eqn. (1).

The transmission function is represented as T(x,y)=1−A(x,y), where A(x,y) is the amplitude attenuation function. Using this and changing to polar coordinates by defining x=r cos θ, y=r sin θ, x'−zα=ρcos Φ, and y'−zβ=ρsin Φ, exploits the exemplary occulter's symmetry to yield:

$$E_{II}(\rho, \phi; z) = E_0(\lambda) e^{i\frac{2\pi}{\lambda}(\alpha\rho\cos\phi + \beta\rho\sin\phi)} e^{i\frac{\pi}{\lambda}(\alpha^2+\beta^2)z} \{1 + \frac{i}{\lambda z} e^{i\frac{\pi}{\lambda z}\rho^2} \int_0^{R_{max}} e^{i\frac{\pi}{\lambda z}r^2} r dr \int_0^{2\pi} A(r,\theta) e^{-i\frac{2\pi}{\lambda z}r\rho\cos(\theta-\phi)} d\theta \} \quad (4)$$

where $R_{max}$ is the maximum radius of the exemplary occulter's attenuation function.

In the exemplary embodiment, a planet or star, at differing field angles, is modeled by changing (α,β), which shifts the output coordinates by (αz,βz), shifting the location of the shadow and tilting the phase with respect to the exemplary telescope. The phase of the shadow field is tilted by a plane wave $$e^{i\frac{2\pi}{\lambda}(\alpha x' + \beta y')}$$

and there is an additional phase shift of the form $\pi/\lambda(\alpha^2+\beta^2)z$ due to the increase in path length of this tilted beam.

Equation (4) can be evaluated for an exemplary binary occulter, by defining:

$$h(r; \rho, \phi) = \int_0^{2\pi} A(r,\theta) e^{-i\frac{2\pi}{\lambda z}r\rho\cos(\theta-\phi)} d\theta \quad (5)$$

and evaluating it as a summation over weighted Bessel functions:

$$h(r; \rho, \phi) = J_0\left(\frac{2\pi}{\lambda z}r\rho\right) N_s \Delta\theta(r) + 4\sum_{k=1}^{\infty} (-1)^k \frac{1}{k} J_{kN_s}\left(\frac{2\pi}{\lambda z}r\rho\right) \cos\left(kN_s\left(\frac{\pi}{2} - \phi\right)\right) \sin\left(\frac{kN_s}{2}\Delta\theta(r)\right) \quad (6)$$

In the exemplary embodiment, $N_s$ the number of petals or spokes in the occulter and Δθ(r) is the angle subtended by a single occulter petal vs. radius. Bessel terms within the summation become rapidly smaller with increasing index k and numerically it was found that only ~10 terms were needed to accurately model the occulters shadow field.

In the exemplary embodiment, modeling of the occulter includes using quadrature to evaluate the integral over r in Eqn. (4) where h(r,ρ,Φ) is evaluated by summing the series in Eqn. (6) for k=1, . . . 10. The intensity at the occulter shadow is subsequently given by $|E_{II}|^2$.

In the exemplary embodiment, numerically, a uniform rectilinear output sampling grid of size N×N spaced by Δx is used, and equation (4) is numerically evaluated for each output sample point converted from rectilinear to polar coordinates. The output grid is centered on the center of the shadow at ρ=0; thus, depending on (α,β), the telescope aperture shifts within the shadow grid, and a tilted phase factor is added. Propagation from the telescope aperture to the focal plane is performed by applying an aperture mask of the form $$circ\left(\frac{\sqrt{x'^2+y'^2}}{D}\right) = \begin{cases} 1 & \text{for } \sqrt{x'^2+y'^2} \leq D/2 \\ 0 & \text{otherwise} \end{cases}$$

(D=telescope diameter) to the shadow field, i.e.

$$E'_{II}(\rho,\Phi;z) = circ(\sqrt{x'^2+y'^2}/D) E_{II}(\rho,\Phi;z) \quad (7)$$

and propagating to the focal plane via fast Fourier transform (FFT) techniques:

$$E_{III}(\theta_x, \theta_y) \propto \int_{-\infty}^{+\infty}\int_{-\infty}^{+\infty} circ\left(\frac{\sqrt{x'^2+y'^2}}{D}\right) E_{II}(x',y';z) e^{-i2\pi\left(\frac{\theta_x}{\lambda}x' + \frac{\theta_y}{\lambda}y'\right)} dx' dy' \quad (8)$$

where $(\theta_x, \theta_y)$ are detector coordinates projected on the sky, i.e., angular sky coordinates.

In the exemplary embodiment, the output field from Eqn. (8) is normalized such that its intensity integral $\iint |E_{III}|^2 d\theta_x d\theta_y$ is equal to the intensity integral over the aperture $$\iint_{Aper} |E'_{II}|^2 \rho d\rho d\phi$$

to conserve flux.

Exemplary Baseline TPF-O Performance

In the exemplary embodiment, the baseline exemplary TPF-O architecture is provided as a 50 meter diameter, 16 petal occulter placed at a separation of 72,000 km from a 4 meter aperture telescope that would nominally operate over the spectral band of 0.4-1.0 microns. This exemplary architecture's performance is scalable to other sizes as discussed above. In the present embodiment, the aperture averaged flux is ~$10^{-10}$ across the entire spectral band of interest. The flux averaged across the aperture gives the suppression factor at the aperture but not the focal plane contrast due to the residual suppressed field being brought to focus. This residual field has some small amount of amplitude and wavefront errors across the aperture. The rms amplitude error varies from 19-52% rms and the rms wavefront error from 35 to 137 nm rms (λ/14 to λ/4) over the spectral band. These errors plus the diffraction from the aperture, spread the leakage flux into a leakage point spread function (PSF). The amplitude and wavefront errors are primarily radially symmetric and appear like small amounts of defocus and spherical aberration, and it is this effect that is responsible for diffuse rings around the leakage PSF. The contrast of the planet-to-starlight leakage, thus, varies with location in the focal plane. This contrast exceeds unity for >52 mas and is >10 at the geometric IWA of 72 mas.

Thus, in the exemplary embodiment, the effective IWA is less than the geometric IWA, implying that it is possible to detect planets that are inside the geometric footprint of the occulter. The stellar leakage decays as ~$1/\theta^2$ where θ is the angular separation between planet and star; thus, the contrast increases with increasing θ.

Accuracy of Fresnel Diffraction for Circular Occulter

In order to determine whether the Fresnel propagation is accurate to $<<10^{-10}$ in intensity within the shadow, the present invention included an assessment for an exemplary uniform circular occulter, i.e., without petals, since the shadow field in the Fresnel approximation is given by:

$$E(\rho) = 1 + \frac{i2\pi}{\lambda z} e^{i\frac{\pi}{\lambda z}\rho^2} \int_0^R e^{i\frac{\pi}{\lambda z}r^2} J_0\left(\frac{2\pi r\rho}{\lambda z}\right) r dr \quad (9)$$

and at $$E(\rho)\Big|_{\rho=0} = 1 + \frac{i2\pi}{\lambda z} \int_0^R e^{i\frac{\pi}{\lambda z}r^2} r dr = e^{i\frac{\pi}{\lambda z}r^2},$$

yields an intensity of $I(\rho)|_{\rho=0}=1$ independent of distance from the occulter.

This appears as an inconsistency, since at z=0 the light would need to diffract into a 90° angle at which point it becomes evanescent and exponentially damped. Thus, light would appear where it would be expected to be dark.

Thus, this issue was assessed with the more rigorous Rayleigh-Sommerfeld (RS) equations, implemented via angular spectrum, which starts with the Helmholtz equation (time harmonic wave equation): $\nabla^2 E(\bar{r}) + k^2 E(\bar{r}) = 0$. Taking its 2D Fourier transform with respect to x, y, but not z, yields a $2^{nd}$ order ordinary differential equation with derivatives only in the distance variable z:

$$\{k^2 - 4\pi^2(f_x^2 + f_y^2)\} E(f_x, f_y; z) + \frac{\partial^2}{\partial z^2} E(f_x, f_y; z) = 0 \quad (10)$$

where $(f_x, f_y)$ are the spatial frequency variables.

Eqn. (12), below, has solutions (for planar boundary conditions) of the form $$E(f_x, f_y; z) = E(f_x, f_y; 0) e^{ikz\sqrt{1-\lambda^2(f_x^2+f_y^2)}},$$

where $E(f_x, f_y; 0)$ is the 2D Fourier transform of the occulter shape and the complex phasor steps the field's transform a distance z. An inverse 2D Fourier transform of $E(f_x, f_y; z)$ yields the shadow field as:

$$E(f_x, f_y; 0) = \delta(f_x, f_y) - RJ_1\left(2\pi R\sqrt{f_x^2 + f_y^2}\right)/\sqrt{f_x^2 + f_y^2} \quad (11)$$

and in polar coordinates $f_x = \rho' \cos \Phi$, $f_y = \rho' \sin \Phi$ gives the shadow field as a function of z but along $\rho=0$ as:

$$E(\rho; z)\Big|_{\rho=0} = e^{ikz} - 2\pi R \int_0^\infty J_1(2\pi R\rho') e^{ikz\sqrt{1-\lambda^2 \rho'^2}} d\rho'$$

Evaluating Eqn. (12) in the limit as z tends to zero yields $$\lim_{z \to 0} E(\rho; z)\Big|_{\rho=0} = 0;$$

the expected physical result, i.e., that there is no light directly behind the occulter.

For $z<<\lambda$ and $R>>\lambda$ the intensity is:

$$I \approx z^2 \left\{ k^2 + \frac{1}{R^2} - \frac{2k}{R} \sin(kR) \right\} \approx k^2 z^2 \quad (13)$$

Figure 3A:
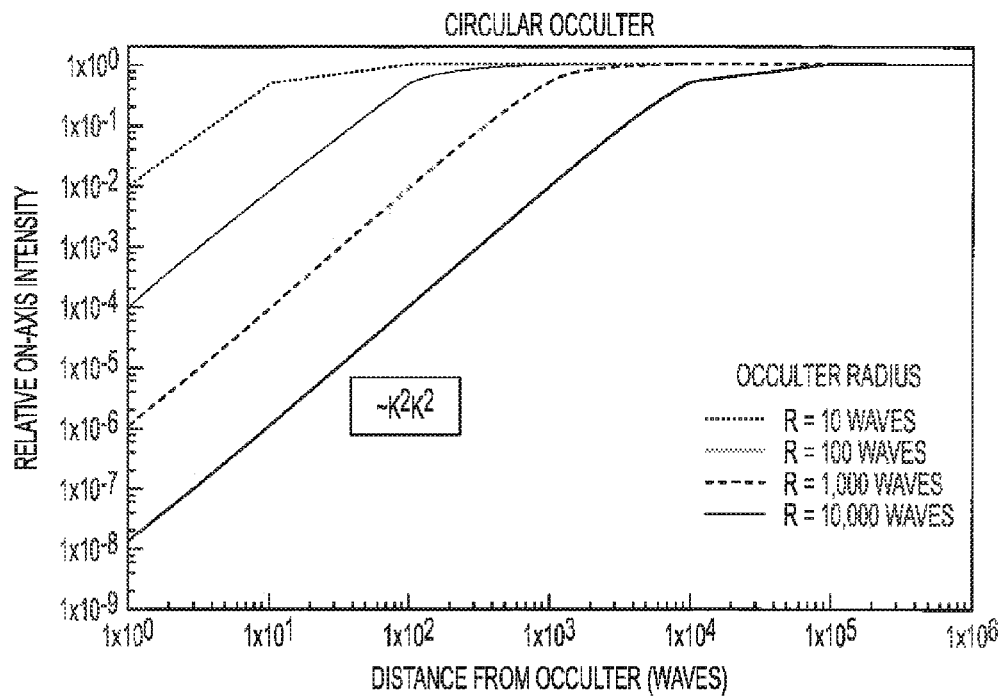
FIG. 3A shows a graph of intensity vs. distance from an external circular occulter.
Figure 3B:
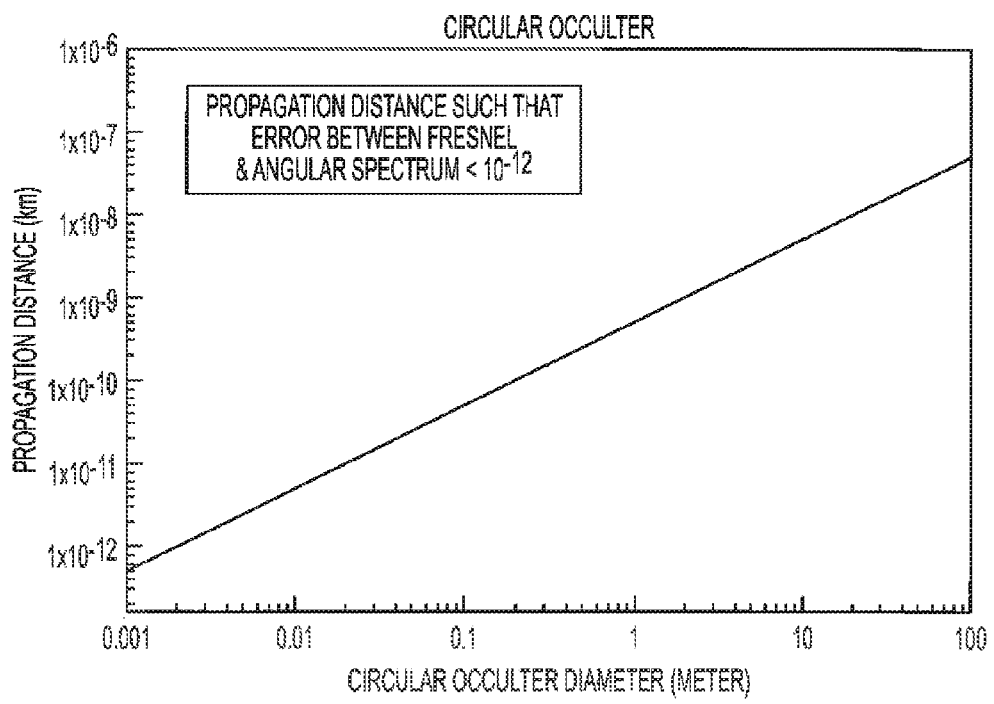
FIG. 3B shows a graph showing propagation from a circular occulter beyond a propagation distance, according to one embodiment consistent with the present invention.

Thus, close to the exemplary occulter, the intensity is proportional to the square of the distance from it. Eqn. (12) was numerically evaluated and the intensity plotted versus distance from the exemplary occulter for various occulter sizes and the result is plotted in FIG. 3A. The intensity of the exemplary circular occulter quickly asymptotes to unity beyond a few 10,000's of wavelengths of light. FIG. 3B plots the propagation distance z such that the absolute error between the Fresnel and RS theory is less than $10^{-12}$ versus occulter diameter. Propagation from an exemplary occulter of diameter 50 meters beyond a propagation distance of $3\times10^{-8}$ km yields a difference between the two theories of $<10^{-12}$, and beyond this, the Fresnel theory is substantially accurate.

Number of Occulter Petals

As in the above embodiment, in approximating an exemplary continuously graded occulter by an exemplary petaled one, the number of the petals must be chosen. The effect of increasing number of petals are smoother walls of the shadows intensity. The shape of the intensity within the center of the shadow, i.e., across the exemplary telescope's aperture, varies little in the range of +/−2 meters except at the very edge. This edge variation makes the external occulter more sensitive to misalignments.

In the exemplary embodiment, a planet at the geometric IWA in the x-direction but with the exemplary occulter shifted by 1 meter in X (top) and in Y (bottom) at 4 wavelengths, a contrast of $>10^{10}$ can be met for 14 or more petals over the wavelength range. If the wavelength range is truncated to 0.55-1.0 μm, then 10 petals is acceptable. If contrast is required to be $10^{11}$ over the entire spectral range, then 16 or more petals are required, and if the spectral range is shortened to 0.55-1.0 μm, then 12 or more petals are required. To meet the requirement of an allowable +/1 meter occulter shift, over the spectral range of 0.4-1.0 microns, with a contrast of $10^{11}$ at the IWA, then this requires 16 or more petals.

Occulter Model with Shape Errors

Errors in an occulter may develop in manufacturing, deployment, when micro-meteorites hit the occulter in space flight, or when deformations of the occulter occur due to excitations of structural eigenmodes during thrusting, and due to reaction/momentum wheels during observations. Errors of these types are likely to cause the suppression depth of the occulter's shadow field to be less than the design value, i.e., brighter, allowing more star light to leak through to the focal plane and reducing the contrast.

In the present invention, modeling of shape errors and holes errors was performed by constructing a perturbed model of the exemplary external occulter, and propagating from the occulter to the telescope aperture via scalar Fresnel propagation as described above.

Thereafter, the next steps in the modeling of the present invention, included letting shape errors in the occulter attenuation function be represented by $\delta A(r,\theta)$, and the full attenuation function be given by $A(r,\theta)+\delta A(r,\theta)$, where $A(r,\theta)$ is the unperturbed attenuation function for which the solution is found via Eqns. (4) and (6). The perturbed shadow is calculated by Fresnel diffraction and coherently added to the unperturbed field, i.e., $E'(\rho,\Phi)=E(\rho,\Phi)+\delta E(\rho,\Phi)$. This approach lends itself well to numerical analysis since the full solution only needs to be solved once.

The perturbing field arises from the shape errors and/or holes, bumps along the edges, or "bites" or pieces missing from the edge, and these errors can be thought of as a new source, i.e., a radiator or absorber which coherently interferes with the unperturbed light. In Cartesian coordinates the perturbing field in the shadow is given by $$\delta E(x', y') = \frac{i}{\lambda z}\int_{-\infty}^{+\infty}\int_{-\infty}^{+\infty}\delta A(x,y)e^{i\frac{\pi}{\lambda z}[(x-x')^2+(y-y')^2]}dxdy \quad (14)$$

where $\delta A(x,y)$ is decomposed into a set of M primitive features, with each primitive centered on $(x_k, y_k)$, and of width $s_k$, of the form $$\delta A(x,y) = \sum_{k=1}^{M} a_k rect\left\{\frac{x-x_k}{s_k}\right\}rect\left\{\frac{y-y_k}{s_k}\right\}$$

where $\alpha_k$ is the attenuation (for an edge bump, or the gain for a hole or tear) of that decomposed piece of the feature, and $$rect\left\{\frac{x-x_k}{s_k}\right\}rect\left\{\frac{y-y_k}{s_k}\right\}$$

is the shape function of that piece feature—e.g., a small tear or hole in the occulter, which can be decomposed into a set of fine rectangular, triangular or circular functions, i.e., any basis functions of which the two-dimensional (2D) Fourier transform is known.

The widths of the primitives of the decomposed features are chosen small such that their Fresnel numbers are $s_k^2/\alpha z \ll 1$, implying that the occulter's shadow is in the far field of each of the primitives of the decomposed pieces. Under these assumptions, Eqn. (14) can be evaluated to yield for:

$$\delta E(x', y') \approx \quad (15)$$
$$\frac{i}{\lambda z}\sum_{k=1}^{M} a_k s_k^2 \text{sinc}\left(\frac{s_k}{\lambda z}(x'-x_k)\right)\text{sinc}\left(\frac{s_k}{\lambda z}(y'-y_k)\right)e^{i\frac{\pi}{\lambda z}[(x'-x_k)^2+(y'-y_k)^2]}$$

Thus, in the present invention, a simple summation over only the region with errors is performed, making this approach numerically fast for localized errors. In practice, the shape of primitive function matters little under the assumption of operating in the primitive's far field. This is due to these localized occulter features having a slowly varying global effect on the occulter shadow, thus, e.g., assuming an exemplary single primitive feature width of 1 mm, wavelength of 0.5 microns and distance to occulter of 72,000 km, yields a Fresnel number of $2.8\times10^{-8}$ which is much less than unity and hence in the far-field. For an exemplary 50 meter diameter occulter with a 4 meter aperture the sinc function varies from center-to-edge by 0.99999997969 and thus, the sinc product in Eqn. (15) varies from 1 to 0.99999995938 or 4 parts in $10^8$ in field, or $1.6\times10^{-15}$ in intensity across the aperture, due to the 1 mm$^2$ primitive. This is true nearly independent of the shape of the primitive so long as the primitive is small with respect to the far field distance. The amplitude of the field is given by $s_k^2/\lambda z = 2.8\times10^{-8}$ and intensity by $7.7\times10^{-16}$.

Thus, a relatively straightforward analysis can be used to treat shape errors, first by calculating the ideal field, and coherently combining it with the perturbing field. This analysis was used to treat single petal truncation errors, and truncation of all petals and holes within the occulter as described below.

Single Petal Truncation Error Example

In one embodiment, truncation errors for a single petal were modeled via the analysis above. In one example, a single petal was truncated from 0 to 220 mm in 10 mm increments, and propagated by Fresnel propagation (as described above) to the telescope aperture, and through to the focal plane. The effect of this truncation within the occulter shadow is that the light within the shadow increases with a slight gradient towards the truncated petal. In the difference between an error-free occulter and a truncated petal occulter intensity, stellar leakage occurs in the focal plane with increasing truncation; at less than 10 mm of truncation no evidence of the truncation visually appears, but for >10 mm of error, a bright localized speckle appears and this speckle increases in brightness with increasing error until it dominates the stellar leakage beyond 30 mm. Errors of this type appear like focal plane speckle and can be confused with planets. In the contrast between a planet and the leakage with increasing truncation error for a planet located at the IWA but not at the location of the speckle, i.e. along x=0, this function varies slowly and if the location of the planet and the damaged petal is known a priori, then the occulter could be rotated to move the speckle away from the planet but otherwise an allowable single petal truncation error is ~10 mm or less.

All Petals Truncated Error Example

In one exemplary embodiment, all petals were truncated by the same amount to assess the effect. The results show an increase in brightness of the occulter shadow intensity with increasing truncation of all the petals. The difference between the error-free and the truncated petal occulter's shadow intensity shows that the focal plane stellar leakage grows with increasing truncation error. The contrast drops from ~30 without any errors to unity at truncation errors of ~18 mm, and to hold the contrast at 10 or above requires that all petals be truncated by 8 mm or less.

Filled, Segment and Sparse Aperture Telescopes

The external occulter suppresses the starlight prior to entering the telescope with minimal modification of the planet light. Thus, a filled, segmented or even a sparse aperture telescope will effectively collect the light and bring it to focus. The main effect of the telescope aperture shape is the shape of the diffraction in the focal plane. The more diffractive structure within the aperture, such as segment boundaries, gives more diffractive spreading, decreasing photometric sensitivity.

With a telescope having a segmented on-axis primary mirror with a secondary mirror mounted on spider, diffraction flairs are evident in the color stretched image; thus, slightly reducing the photometric sensitivity.

Accordingly, an external occulter system will work with filled, segmented or even sparse aperture systems; thus, opening up the trade space for alternative flight architectures.

Focal Plane Sampling

In one embodiment, different samplings on focal plane images was conducted, with images of stellar leakage plus planet sampled and spatially integrated over detector pixels that are for λ/4D (projected on the sky for star-planet separations of 40,50,60,70 and 80 mas), for λ/2D detector pixels, and for λ/D detector pixels. The λ/D pixels appeared visually coarse, however, when contrast a pixel for the 3 samplings are plotted versus angular separation they do not significantly differ for the 3 cases. Thus, the signal-to-noise ratio (SNR) will vary with sampling.

Occulter Acquisition and Pointing

In another embodiment consistent with the present invention, following completion of a given science observation the exemplary occulter is moved with thrusters to the new target star and the telescope repointed. After the telescope has acquired and locked onto the target star, it acquires and senses the location of the occulter to insure that the contrast is maintained throughout the observation.

Figure 4:
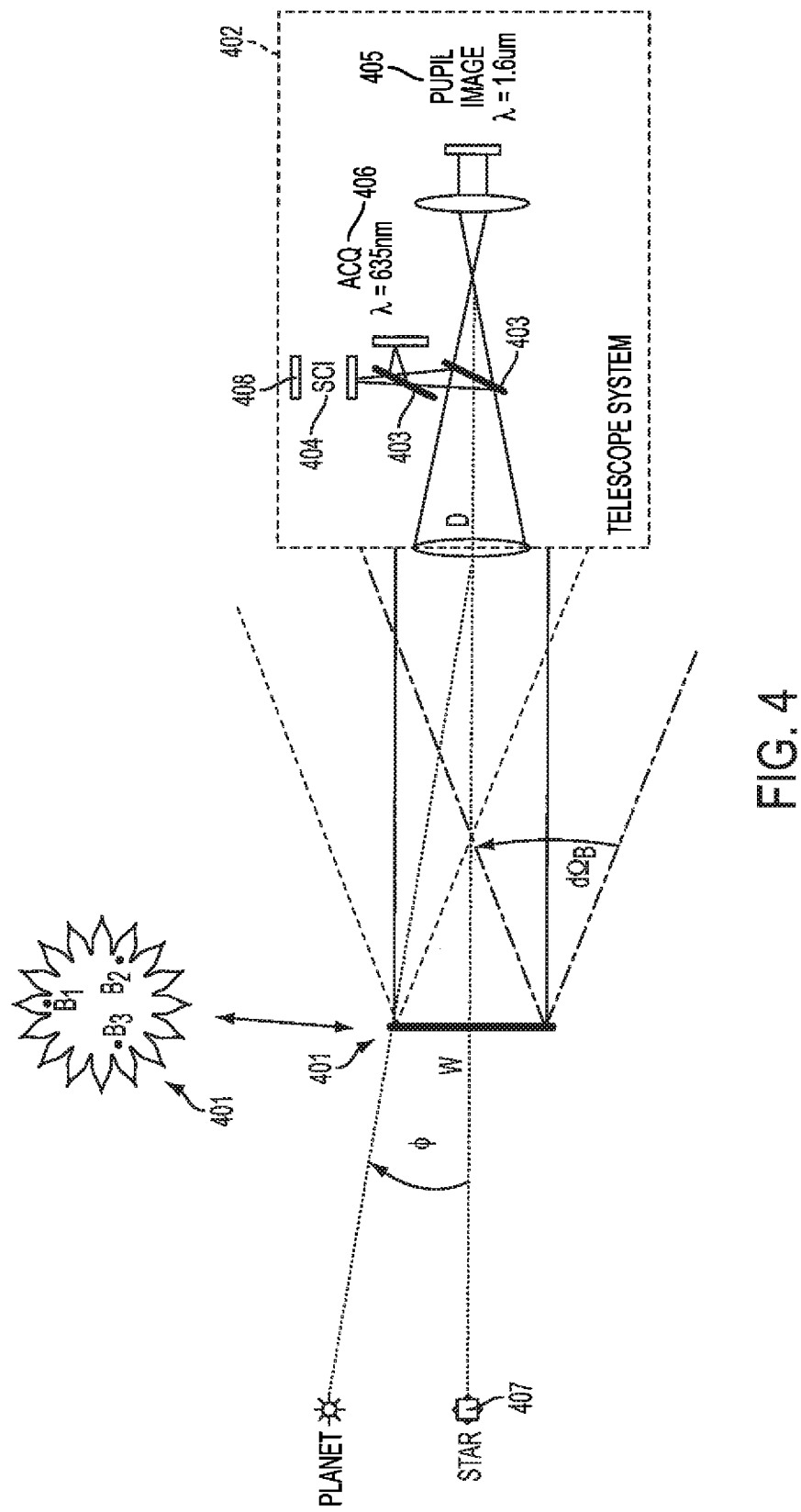
FIG. 4 shows an occulter acquisition arrangement according to one embodiment consistent with the present invention.

One exemplary approach includes a two-stage process where, for example, a plurality of small laser beacons (diode lasers), for example, three beacons $B_1$-$B_3$, are mounted approximately equidistant from one another at the petal base around the circular edge of the body of the exemplary occulter 401 (see FIG. 4). Although three beacons $B_1$-$B_3$ are shown, one of ordinary skill in the art would know that a greater number would achieve more accuracy and precision of sensing, as long as flight risk and costs due to additional software, are considered reasonable.

Each beacon $B_1$-$B_3$ would be a diode laser of ~1 mm² aperture and, as an example, □=635 nm was used, and emitting ~1 milliwatt of power each. In this example, each of the lasers $B_1$-$B_3$ could be pulse code modulated at a different temporal frequency. The focal plane of the science instrument (telescope system 402) are separated with beamsplitters 403 into, for example, three channels—i.e., a science channel 404, a pupil imaging channel 405, and a coarse acquisition channel 406, as shown schematically in FIG. 4.

In this exemplary embodiment, the coarse acquisition channel 406 acquires one or more spots from the diode lasers $B_1$-$B_3$. Each of the laser's beam diverges from the occulter 401 into an angle of $\theta_F = 2\lambda/\pi w_0 = 0.4$ milli-radians (83 arcseconds). Thus, if the occulter 401 of the present invention was laterally shifted by ½ this angle, i.e., a distance of +/−0.2 milli-rads*72,000 km=+/−29 km, its laser beacons $B_1$-$B_3$ would be seen and focused by the telescope 402. In this exemplary embodiment, the field-of-view of the telescope 402 plus coarse acquisition sensor 406 should be at least 83 arcseconds.

In the exemplary embodiment, in the event that the three laser beacons $B_1$-$B_3$ are placed on the dark side of the occulter 401 at 60% of the occulter 401 radius, i.e., at 15 meters from its center, then 26 meters would separate them all from each other. In this exemplary embodiment, at an exemplary 72,000 km, this is an angular separation of the spots by 2.3 λ/D for a 4 meter telescope 402, resulting in that the spots are easily discriminated in the coarse acquisition focal plane. In the exemplary embodiment, providing three laser beacons $B_1$-$B_3$ in addition to supplying redundancy, also allows the lasers $B_1$-$B_3$ to be slightly shifted in angle, i.e., off normal to the occulter 401, giving effectively a larger capture range. The exemplary attitude control system on the exemplary occulter 401, ensures that the normal to the occulter surface was aligned to the target star to +/−5 arcseconds. The collected laser power is:

$$\sim P_L \cdot \Omega_{Tel}/\Omega_{Beam} \approx 10^{-8} P_L,$$

where $P_L$ is the power of the laser $B_1$-$B_3$, $\Omega_{Tel}$ is the solid angle subtended by the telescope 402 as seen from the occulter 401, and $\Omega_{Beam}$ is the solid angle that the laser beam diverges into.

In the exemplary embodiment, a 1 milliwatt laser gives approximately $10^6$ photons/second collected by a 4 m telescope at 72,000 km, yielding a SNR of ~1000 in 1 second. The exemplary embodiment uses a 4096×4096 focal-plane array mapped to a capture range of +/−83 arcseconds, which gives 1.3 λ/D sampling; and a simple centroiding algorithm resolves the occulter location to <¼ of this, or at the exemplary occulter to a resolution of +/−3.5 meters.

Following the coarse acquisition, in the exemplary embodiment, the pupil imaging channel 405 is used to sense the exemplary occulter's lateral location within 1 meter of its ideal location along the line of sight to the target star 407. The pupil imaging channel 405 images a region of the occulter's shadow truncated by the telescope aperture, i.e., an image of the telescope's entrance pupil, onto a camera 408 at 1.6 microns. The acquisition camera 408 may be a near-IR camera 408, for example, or other suitable camera, and operates at a wavelength or range of wavelengths, that is outside the science spectral bandpass. The camera 408 would be located at or near the science focal plane (i.e., SCI in FIG. 4).

Lateral shifts of the exemplary occulter 401 will change the pattern and flux on the pupil imaging camera, and using an exemplary wavelength outside the spectral band over which the occulter design has been optimized, results in an increase in flux (i.e., the depth of the shadow is only ~0.0002 in H-band as opposed to ~$10^{-10}$ in V-band within the spectral band optimized shadow).

Once the occulter's shadow walks entirely off the telescope aperture, only a uniform illumination of the pupil will result. The error signal is the integral of the left half of the pupil image differenced from the integral of the right half, divided by the sum of the flux in the entire pupil. The double bump value in the S-curve center comes from the "bump" in the center of the shadow intensity and varies with wavelength. In other embodiments, the fine acquisition channel wavelength can make the S-curve single valued. It is this S-curve, in both x- and y-directions, along with the starlight suppressed science image, which can be used to fine sense the location of the occulter and feed back to the occulter's control system to maintain its position throughout an observation.

Table 2 lists the baseline exemplary TPF-O system and a partial list of sensitivities according to one embodiment consistent with the present invention.

TABLE 2

| TPF-O Baseline System and Sensitivities | |
|---|---|
| Occulter + Telescope System | |
| Occulter Diameter: | W = 50 meters |
| Telescope Diameter: | D = 4 meters |
| Separation: | z = 72,000 km |
| Wavelength Range: | Δλ = 0.4-1.0 um |
| Fresnel # @ λ = 0.5: | $F_N$ = 69.4 |
| Number of Petals: | N = 16 |
| Occulter form: | Vanderbei |
| Geometric IWA: | 72 mas |
| Effective IWA: | 52 mas |
| Focal plane contrast: | >10 |
| Sensitivities | |
| Occulter Holes: Area | <3 cm² |
| Single Petal Error: | <10 mm |
| All Petal Truncation Error: | <8 mm |
| Misalignment Sensing: | <10 cm |

TABLE 2-continued

TPF-O Baseline System and Sensitivities

| Misalignment Control: | <+/−1 meter |
|---|---|
| Coarse Acquisition (Laser Beacons) | |
| Number of laser beacons = | 3 |
| Wavelength: | $\lambda = 0.635$ um |
| Beacon aperture: | $w_0 = 1$ mm |
| Focal plane: | 4069 × 4096 pixels |
| Sampling: | $\Delta x = 33$ mas |
| Capture range: | +/−29 km |
| Capture resolution: | +/−3.5 meters |
| Time to SNR 1000: | 1 second |
| Fine acquisition (Pupil Imaging) | |
| Wavelength: | $\lambda = 1.66$ um (H-band) |
| Fine acquisition focal plane: | 1024 × 1024 pixels |
| Sampling at occulter: | $\Delta x = 3.9$ mm |
| Capture range: | +/−8 meters |
| Capture resolution: | 8 mm |

An external occulter coronagraph according to the present invention, has the advantage that the starlight is suppressed before entering the telescope thereby levying no stringent optical requirements on the telescope. The occulter of the present invention has no outer working angle that usually arises from a deformable mirror which corrects speckle out to specific outer working angle on the sky. The inner working angle (IWA) is nearly independent of wavelength over the optimized spectral band. The occulter of the present invention works with filled, segmented or even sparse or interferometric aperture approaches, and can be combined, in a hybrid or cascaded fashion, with other embodiments either to give a useful margin in the design, or to potentially relax requirements on both the external occulter and internal coronagraphic scheme. Acquisition sensing, both coarse and fine, of the exemplary occulter is relatively straightforward and imposes no stressing requirements. No active wavefront, amplitude or polarization sensing or control are required at stringent levels. Some wavefront control, akin to the James Webb Space Telescope (JWST), may be required within the telescope. The occulter system of the present invention is inherently high throughput since the planet is only suppressed by the occulter if it falls within the outer edge of the occulter. The exemplary occulter has broad spectral response from 0.4-1.0 microns. The exemplary occulter of the present invention does require two spacecraft with formation flying control to <1 meter lateral to the line of sight and ~200 km in the z-direction. This approach for direct terrestrial planet detection and characterization provides significant advantages.

Embodiments within the scope of the present invention may also include computer-readable media for carrying or having computer-executable instructions or data structures stored thereon. Such computer-readable media can be any available media that can be accessed by a general purpose or special purpose computer, including the functional design of any special purpose processor as discussed above. By way of example, and not limitation, such computer-readable media can comprise RAM, ROM, EEPROM, CD-ROM or other optical disk storage, magnetic disk storage or other magnetic storage devices, or any other medium which can be used to carry or store desired program code means in the form of computer-executable instructions, data structures, or processor chip design. When information is transferred or provided over a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable media.

Computer-executable instructions include, for example, instructions and data which cause a general purpose computer, special purpose computer, or special purpose processing device to perform a certain function or group of functions. Computer-executable instructions also include program modules that are executed by computers in stand-alone or network environments. Generally, program modules include routines, programs, objects, components, data structures, and the functions inherent in the design of special-purpose processors, etc., that perform particular tasks or implement particular abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Those of skill in the art will appreciate that other embodiments of the invention may be practiced in network computing environments with many types of computer system configurations, including personal computers, hand-held devices, multi-processor systems, microprocessor-based or programmable consumer electronics, network PCs, minicomputers, mainframe computers, and the like. Embodiments may also be practiced in distributed computing environments where tasks are performed by local and remote processing devices that are linked (either by hardwired links, wireless links, or by a combination thereof) through a communications network. In a distributed computing environment, program modules may be located in both local and remote memory storage devices.

The various embodiments described above are provided by way of illustration only and should not be construed to limit the invention. For example, the principles herein may be applied to spacecraft operating millions of miles from Earth in unexpected and unplanned environments or to more terrestrial robots in dynamic, nontrivial environments. Those skilled in the art will readily recognize various modifications and changes that may be made to the present invention without following the example embodiments and applications illustrated and described herein, and without departing from the true spirit and scope of the present invention.

What is claimed is:

1. A method of modeling an external occulter, the method comprising:
   providing at least one processor executing program code to implement a simulation system, said program code including the steps of:
   providing an external occulter having a plurality of petals, said occulter being coupled to a telescope; and
   propagating light from said occulter to a telescope aperture of said telescope by scalar Fresnel propagation, by:
   obtaining an incident field strength at a predetermined wavelength at an occulter surface;
   obtaining a field propagation from said occulter to said telescope aperture using a Fresnel integral;
   modeling a celestial object at differing field angles by shifting a location of a shadow cast by said occulter on said telescope aperture;
   calculating an intensity of said occulter shadow on said telescope aperture; and applying a telescope aperture mask to a field of said occulter shadow, and propagating said light to a focal plane of said telescope via fast Fourier transform (FFT) techniques;

separating a focal plane of said telescope into a plurality of channels, using beamsplitters;

acquiring one or more beam spots from said laser beacons using a coarse acquisition channel of one of said plurality of channels;

sensing a lateral location of said occulter using a pupil imaging channel of another of said plurality of channels; and using a fine acquisition channel of another of said plurality of channels, to fine sense said location of said occulter.

2. The method of claim 1, wherein said occulter is a binary occulter approximated by a radially symmetric occulter.

3. The method of claim 1, wherein said celestial body is a planet, and
wherein an effective inner working angle (IWA) is less than a geometric IWA, allowing detection of said planet inside a geometric footprint of said occulter.

4. The method of claim 1, wherein said plurality of petals is more than 10.

5. The method of claim 1, the method further comprising:
modeling of shape errors and holes errors in said occulter by:
calculating a perturbed shadow of said occulter by Fresnel diffraction and coherently adding to an unperturbed field; and then
propagating from said occulter to said telescope aperture via said scalar Fresnel propagation.

6. The method of claim 1, wherein a single petal of said plurality of petals has an allowable truncation error of 10 mm or less.

7. The method of claim 1, wherein said plurality of petals has an allowable truncation error of 8 mm or less.

8. The method of claim 1, wherein said telescope aperture is one of a filled, segmented or sparse aperture system.

9. The method of claim 1, the method further comprising:
conducting a plurality of samplings on images obtained from said focal plane; and
spatially integrating said sampled images with images of stellar leakage over $\lambda/4D$, $\lambda/2D$, and $\lambda/D$ detector pixels.

10. The method of claim 1, wherein said occulter includes a plurality of laser beacons mounted at bases of said plurality of petals, said laser beacons being pulse code modulated at a different temporal frequency.

11. An external occulter system, the system comprising:
at least one processor executing program code, said program code including the steps of:
providing an external occulter having a plurality of petals, said occulter being coupled to a telescope; and
propagating light from said occulter to a telescope aperture of said telescope by scalar Fresnel propagation, by:
obtaining an incident field strength at a predetermined wavelength at an occulter surface;
obtaining a field propagation from said occulter to said telescope aperture using a Fresnel integral;
modeling a celestial object at differing field angles by shifting a location of a shadow cast by said occulter on said telescope aperture;
calculating an intensity of said occulter shadow on said telescope aperture; and
applying a telescope aperture mask to a field of said occulter shadow, and propagating said light to a focal plane of said telescope via fast Fourier transform (FFT) techniques,
wherein a focal plane of said telescope is separated into a plurality of channels using beamsplitters; and
wherein one or more beam spots from said laser beacons are acquired using a coarse acquisition channel of one of said plurality of channels;
wherein a lateral location of said occulter is sensed using a pupil imaging channel of another of said plurality of channels; and
wherein a fine acquisition channel of another of said plurality of channels, is used to fine sense said location of said occulter.

12. The system of claim 11, wherein said occulter is a binary occulter approximated by a radially symmetric occulter.

13. The system of claim 11, wherein said celestial body is a planet, and
wherein an effective inner working angle (IWA) is less than a geometric IWA, allowing detection of said planet inside a geometric footprint of said occulter.

14. The system of claim 11, wherein said plurality of petals is more than 10.

15. The system of claim 11, wherein modeling of shape errors and holes errors in said occulter is obtained by a calculation of a perturbed shadow of said occulter by Fresnel diffraction and a coherent addition to an unperturbed field; and then a propagation from said occulter to said telescope aperture via said scalar Fresnel propagation.

16. The system of claim 11, wherein a single petal of said plurality of petals has an allowable truncation error of 10 mm or less.

17. The system of claim 11, wherein said plurality of petals has an allowable truncation error of 8 mm or less.

18. The system of claim 11, wherein said telescope aperture is one of a filled, segmented or sparse aperture system.

19. The system of claim 11, wherein a plurality of samplings on images are obtained from said focal plane; and
wherein said sampled images are spatially integrated with images of stellar leakage over $\lambda/4D$, $\lambda/2D$, and $\lambda/D$ detector pixels.

20. The system of claim 11, wherein said external occulter includes a plurality of laser beacons mounted at bases of said plurality of petals, said laser beacons being pulse code modulated at a different temporal frequency.

21. A non-transitory computer-accessible medium having a program which contains executable instructions, the program comprising the steps of:
providing an external occulter having a plurality of petals, said occulter being coupled to a telescope; and
propagating light from said occulter to a telescope aperture of said telescope by scalar Fresnel propagation, by:
obtaining an incident field strength at a predetermined wavelength at an occulter surface;
obtaining a field propagation from said occulter to said telescope aperture using a Fresnel integral;
modeling a celestial object at differing field angles by shifting a location of a shadow cast by said occulter on said telescope aperture;
calculating an intensity of said occulter shadow on said telescope aperture; and
applying a telescope aperture mask to a field of said occulter shadow, and propagating said light to a focal plane of said telescope via fast Fourier transform (FFT) techniques;

acquiring one or more beam spots from said laser beacons using a coarse acquisition channel of one of said plurality of channels;

sensing a lateral location of said occulter using a pupil imaging channel of another of said plurality of channels; and using a fine acquisition channel of another of said plurality of channels, to fine sense said location of said occulter.

22. An occulter acquisition system, the system comprising:
a telescope;
an external occulter having a plurality of petals, said occulter being coupled to said telescope;
a plurality of laser beacons mounted at bases of said plurality of petals of said occulter, said laser beacons being pulse code modulated at a different temporal frequency;
a plurality of beamsplitters provided in said telescope, which separate a focal plane of said telescope into a plurality of channels;
wherein said plurality of channels include a coarse acquisition channel which acquires one or more beam spots from said laser beacons, a pupil imaging channel which senses a lateral location of said occulter, and a fine acquisition channel which fine senses said location of said occulter.

23. The occulter acquisition system of claim 22, wherein said laser beacons are laser diodes.

24. The occulter acquisition system of claim 22, wherein beams from said laser beacons are shifted in angle from normal to allow a larger capture range of said occulter.

25. The occulter acquisition system of claim 22, wherein said pupil imaging channel images a region of a shadow of said occulter truncated by an aperture of said telescope.

26. The occulter acquisition system of claim 25, further comprising:
an IR camera which captures said image.

27. The occulter acquisition system of claim 26, wherein lateral shifts of said occulter changes a pattern and flux on said IR camera.

* * * * *